United States Patent [19]
Meyer

[11] Patent Number: 5,443,998
[45] Date of Patent: Aug. 22, 1995

[54] METHOD OF FORMING A CHLORINATED SILICON NITRIDE BARRIER LAYER

[75] Inventor: George R. Meyer, Fremont, Calif.

[73] Assignee: Cypress Semiconductor Corp., San Jose, Calif.

[21] Appl. No.: 878,051

[22] Filed: May 4, 1992

Related U.S. Application Data

[63] Continuation-in-part of Ser. No. 681,411, Apr. 4, 1991, abandoned, which is a continuation of Ser. No. 388,169, Aug. 1, 1989, abandoned.

[51] Int. Cl.$^6$ .............................................. H01L 21/02
[52] U.S. Cl. ........................... 437/241; 437/63; 437/69; 437/70
[58] Field of Search ............................ 437/63, 69, 241

[56] References Cited

U.S. PATENT DOCUMENTS

| | | |
|---|---|---|
| 3,958,040 | 5/1976 | Webb . |
| 4,344,985 | 8/1982 | Goodman et al. ................ 437/244 |
| 4,352,236 | 10/1982 | McCollum . |
| 4,400,865 | 8/1983 | Goth et al. ........................ 437/69 |
| 4,401,691 | 8/1983 | Young ............................... 427/93 |
| 4,551,910 | 11/1985 | Patterson . |

OTHER PUBLICATIONS

Wolf, "Silicon Processing for the VLSI Era" vol. 1, Process Technology, Lattice Press, 1986, pp. 407–409.
Ghandi; *VLSI Fabrication Principals;* pp. 385–391 (1983).
Sze; *VLSI Technology;* pp. 156–157 (1983).
Kahng; *Silicon Integrated Circuits;* pp. 79–81 (1981).

*Primary Examiner*—Brian E. Hearn
*Assistant Examiner*—Trung Dang
*Attorney, Agent, or Firm*—Blakely, Sokoloff, Taylor & Zafman

[57] ABSTRACT

A method of forming a chlorinated silicon nitride barrier layer is disclosed. The method of the present invention includes depositing a silicon nitride layer over a semiconductor substrate. The silicon nitride layer is exposed to an ambient including chlorine at an elevated temperature for a predetermined time to form the chlorinated silicon nitride barrier layer that is resistant to attack by at least one reactive compound.

17 Claims, 8 Drawing Sheets

METHOD OF FORMING A CHLORINATED SILICON NITRIDE BARRIER LAYER

CROSS REFERENCE TO RELATED APPLICATIONS

This is a continuation-in-part of patent application Ser. No. 07/681,411, filed Apr. 4, 1991, now abandoned which is continuation of patent application Ser. No. 07/388,169, filed Aug. 1, 1989 now abandoned.

FIELD OF THE INVENTION

The present invention relates to the field of semiconductor devices, and in particular, to the formation a silicon nitride layer and subsequent processing environments to which the layer is exposed.

BACKGROUND OF THE INVENTION

In the processing of semiconductor devices, particularly metal-oxide-semiconductor (MOS) devices, a silicon nitride layer is often used atop a silicon or silicon dioxide layer to protect the underlying silicon or silicon dioxide from attack during a subsequent wet chemical or oxidation steps. The silicon nitride layer can also be maintained on the device and used as a gate dielectric for the MOS device itself, either alone or with other dielectric layers such as silicon dioxide. A silicon nitride layer or a plurality of silicon dioxide and silicon nitride layers are often used as a gate dielectric, a tunnel dielectric, or an intergate dielectric (between a floating gate and a control gate) on EPROMs or EEPROMs.

The silicon nitride layers must themselves be resistant to attack by wet chemicals including sulfuric acid, hydrogen peroxide, phosphoric acid, hydrofluoric acid and high temperature oxidants including oxygen and steam. At a minimum, the silicon nitride layer often must be attacked very slowly by the wet chemicals and high temperature oxidants. Two methods of modifying the silicon nitride etch rate include annealing and oxidizing the silicon nitride.

A silicon nitride layer may be annealed to lower its etch rate. However, a heat treatment may not lower the etch rate sufficiently to avoid the need for a relatively thicker silicon nitride layer to be certain that sufficient silicon nitride protection remains during and after each subsequent etching or oxidation step. However, a relatively thicker silicon nitride layer is undesirable because it inhibits the precise ability to define the underlying patterns that thinner layers can achieve. Moreover, the relatively thicker layer may degrade device performance when used as a gate dielectric, tunnel dielectric, or intergate dielectric.

Silicon nitride typically is converted to silicon dioxide during a high temperature steam oxidation, such as a field oxidation step. The amount of silicon nitride converted to silicon dioxide depends on the time and temperature of the steam cycle. A similar oxidation of silicon nitride occurs with sulfuric acid because sulfuric acid acts as an oxidizing agent. Sulfuric acid is commonly used for photoresist stripping or as part of a furnace preclean sequence. Although silicon dioxide is more resistant to attack, for example, by phosphoric acid, silicon dioxide is severely attacked by a hydrofluoric acid solution or other wet chemical oxide etching solutions that are typically used in many semiconductor process sequences. The repetitive oxidations of a silicon nitride layer and exposures to wet chemicals may cause the silicon nitride layer to become too thin and fail as as a protective layer.

SUMMARY OF THE INVENTION

The present invention includes a method of forming a chlorinated silicon nitride barrier layer that is more resistant to attack by wet chemicals and high temperature oxidants. The method includes depositing a silicon nitride layer over a semiconductor substrate followed a high temperature exposure to chlorine. Preferably, the chlorination step is performed as the first processing step after the silicon nitride layer is deposited.

The chlorinated silicon nitride barrier layer yields a number of benefits because of its resistance to attack by the wet chemicals and high temperature oxidants. The increased resistance to attack by the wet chemicals and high temperature oxidants allows a thinner silicon nitride layer to be used. A gate or tunnel dielectric having the thinner silicon nitride layer typically forms a faster operating device. When used as an intergate dielectric, capacitive coupling between a control gate and a floating gate increases. The thinner silicon nitride layer also requires less overetch during patterning steps and may reduce substrate damage that may occur during an overetch portion of a dry etch step. The chlorinated silicon nitride barrier layer is believed to have electrical and optical properties similar to a silicon nitride layer that is not chlorinated. The barrier layer allows longer exposure times to wet chemicals and high temperature oxidants because the barrier layer is more resistant to attack by the wet chemicals and high temperature oxidants.

Other objects, features, and advantages of the present invention will be apparent from the accompanying drawings and from the detailed description that follows.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

The present invention includes a method of forming a chlorinated silicon nitride barrier layer that is more resistant to attack by reactive compounds. As used in this specification, a reactive compound is defined as a compound that is a wet chemical or high temperature oxidant that may react with silicon nitride. Wet chemicals include sulfuric acid, hydrogen peroxide, phosphoric acid, hydrofluoric acid, buffered oxide etching solutions, ammonium fluoride solutions, etc., and high temperature oxidants include oxygen and steam at a temperature of at least 600° C. The reactive compounds do not include not dry etching compounds used in dry etching methods, such as plasma etching, reactive ion etching, ion milling, and sputter etching, for example. In its simplest form, the method includes the steps of depositing a silicon nitride layer over a semiconductor substrate and a high temperature exposure to chlorine. Preferably, the chlorination step is performed as the first processing step after the silicon nitride layer is deposited. In a preferred embodiment, the chlorination step is perforated in an ambient comprising oxygen and about 3% hydrogen chloride at a temperature between about 800° C. and about 1100° C. for a time between about 10 and about 60 minutes. The chlorination step converts the surface of the silicon nitride layer into the chlorinated silicon nitride barrier layer. The thickness of the barrier layer is at least 1 Å thick and is typically between about 5 Å and about 100 Å thick.

In alternate embodiments, the ambient, times, and temperatures of the chlorination step may be changed. The chlorine source may include molecular chlorine, hydrogen chloride, 1,1,1-trichloroethane, and 1,1,2-trichloroethene. Oxygen is not believed to be necessary, but oxygen may be included to reduce the chances of silicon pitting. Pressure limits are not known, but the chlorination step should be performed at least about atmospheric pressure. The examples described below include chlorination steps that are performed at about atmospheric pressure. The thickness of the barrier layer is believed to be a function of the time and temperature of the chlorination step, such that the barrier layer becomes thicker with longer chlorination time and/or higher chlorination temperature. No known theoretical time limits are known. The chlorination time typically is limited by other processing considerations, such as a dopant diffusion, if a dopant is present, for example. The temperature of the chlorination step is typically between about 600° C. and about 1200° C. The chlorination step does not need to immediately follow the chemical deposition of the silicon nitride layer, but the chlorination step should be performed before the silicon nitride layer is exposed to any reactive compounds.

The silicon nitride layer may be deposited directly on a silicon layer or may be deposited on a silicon dioxide layer. The silicon dioxide layer may be thermally grown or chemically deposited and is typically between about 80 Å and about 500 Å thick. The thickness of the silicon dioxide layer is typically dependent upon other considerations not related to the silicon nitride layer being attacked by the reactive compounds.

The chlorinated silicon nitride barrier layer yields a number of benefits because of its resistance to attack by the reactive compounds. The increased resistance to attack by the reactive compounds allows a thinner silicon nitride layer to be used. A gate or tunnel dielectric having the thinner silicon nitride layer typically forms a faster operating device. When used as an intergate dielectric, capacitive coupling between a control gate and a floating gate increases. The thinner silicon nitride layer also requires less overetch during patterning steps and may reduce substrate damage that may occur during an overetch portion of a dry etch step. The chlorinated silicon nitride barrier layer is believed to have electrical and optical properties similar to a silicon nitride layer that is not chlorinated. The barrier layer allows longer exposure times to the reactive compounds because the barrier layer is more resistant to attack by the reactive compounds.

Four examples that form the chlorinated silicon nitride barrier layer are described below. The examples are presented to illustrate some embodiments and are not intended to be limiting. The barrier layer should be used where silicon nitride layer attack by a reactive compound may be a concern. The present invention may be used with any semiconductor technology including MOS, bipolar, BiCMOS, metal-insulator-semiconductor, and III-V semiconductor technologies.

EXAMPLE 1

Two sets of four silicon substrates each were prepared. Each substrate had a silicon nitride layer about 900 Å thick atop a silicon dioxide layer about 380 Å thick. A first set of four substrates were placed into a furnace at about 900° C. for about 50 minutes in an ambient including about 97% oxygen and about 3% hydrogen chloride. A second set of four substrates were placed into a furnace at about 900° C. for about 50 minutes in an ambient including essentially pure oxygen with no hydrogen chloride, and thus were not subjected to the chlorination step of the invention. One substrate from each set was dipped in a 50:1 hydrofluoric acid solution (50 parts deionized water to 1 part hydrogen fluoride) for 30 seconds. The next pair of substrates was dipped for 60 seconds; the next pair for 90 seconds; and the last pair for 120 seconds.

Figure 1A:
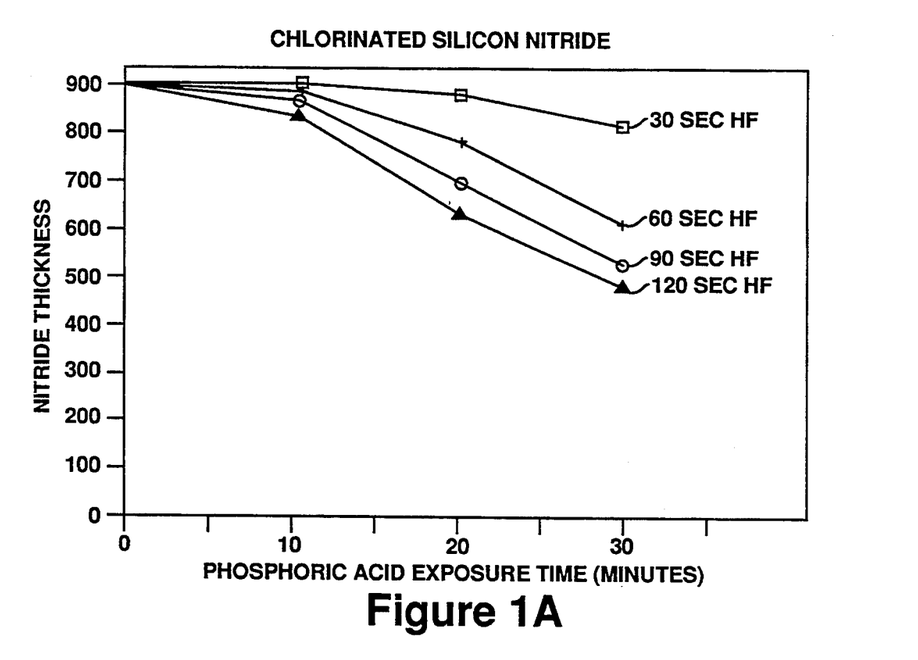
FIGS. 1A–1B include graphs showing the benefits of a chlorinated silicon nitride barrier layer.
Figure 1B:
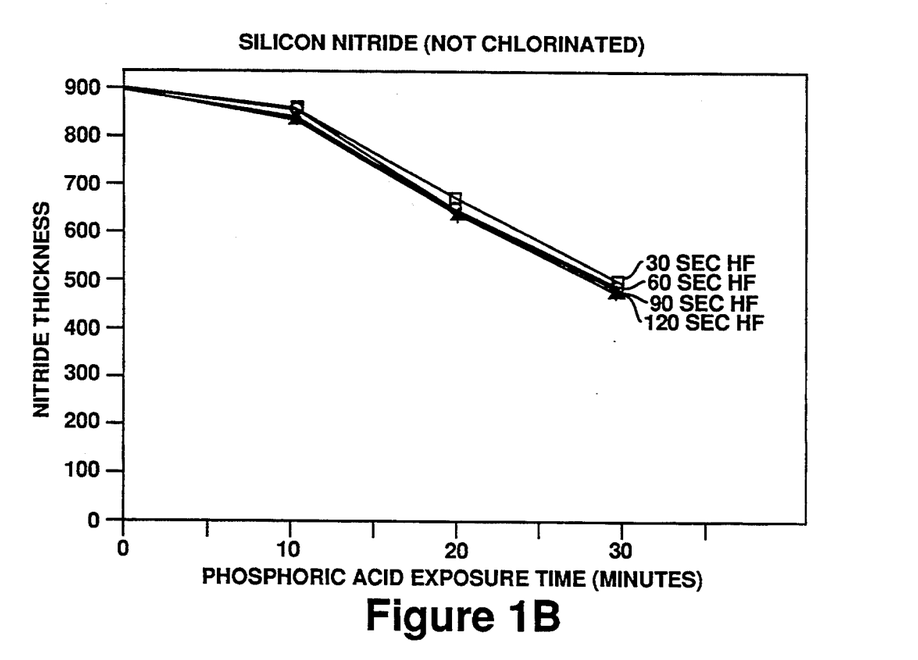

FIGS. 1A and 1B include graphs showing the thickness of silicon nitride remaining on the substrates after a phosphoric acid solution dip at 135° C. for time periods between 10 and 30 minutes. The phosphoric acid solution used was about 80% phosphoric acid and about 20% deionized water. The combination of the barrier layer and silicon nitride layer in FIG. 1A was measured as a single silicon nitride film using a NanoSpec/AFT brand measurement apparatus. Measuring the combination of barrier layer and silicon nitride layer as a single silicon nitride layer is not expected to add significant error to the measurements because the barrier layer is believed to have optical properties similar to silicon nitride. The raw data were adjusted so that the combined thickness of the barrier and silicon nitride layers as illustrated in FIGS. 1A and 1B started at 900 Å before the substrates were exposed to the acidic solutions. When comparing the data shown in FIGS. 1A and 1B, it is clear that the substrates exposed to the hydrogen chloride according to an embodiment of the present invention were significantly thicker at each phosphoric acid exposure time compared to the substrates that were not chlorinated.

EXAMPLE 2

Figure 2A:
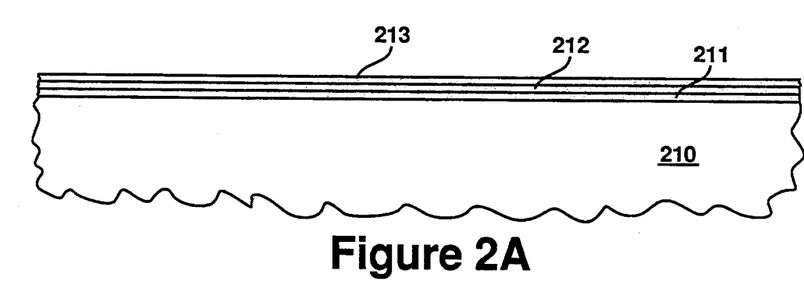
FIGS. 2A–2D include illustrations of cross sectional views of a semiconductor substrate described in conjunction with Example 2.

A field isolation area may be formed using a chlorinated silicon nitride barrier layer as part of an oxidation mask during a local oxidation of silicon (LOCOS) field isolation process. Referring to FIG. 2A, a pad oxide layer 211 is thermally gown from a monocrystalline silicon layer (silicon layer) 210 of a semiconductor substrate to a thickness of about 380 Å. A silicon nitride layer 212 is chemically deposited over the pad oxide layer 211 to a thickness of about 900 Å. The formation of the pad oxide layer 211 and silicon nitride layer 212 are well known in the art.

In accordance with an embodiment of the present invention, the silicon nitride layer 212 is exposed to an ambient including oxygen and about 3% hydrogen chloride at about 1000° C. in for about 30 minutes to form a chlorinated silicon nitride barrier layer 213 from a portion of the silicon nitride layer 212. The chlorine reacts with the silicon nitride to form the barrier layer 213 that is more resistant to attack by the reactive compounds than a silicon nitride layer 212 without the barrier layer.

Figure 2B:
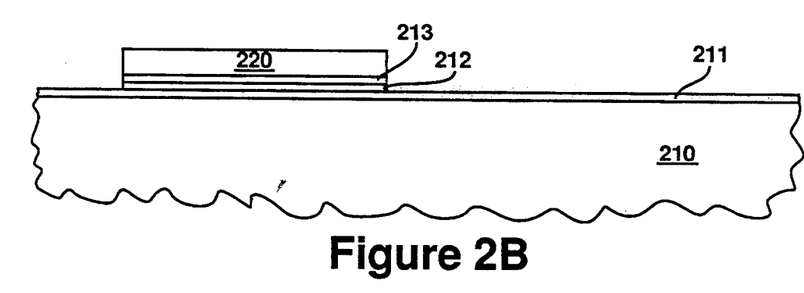
Figure 2C:
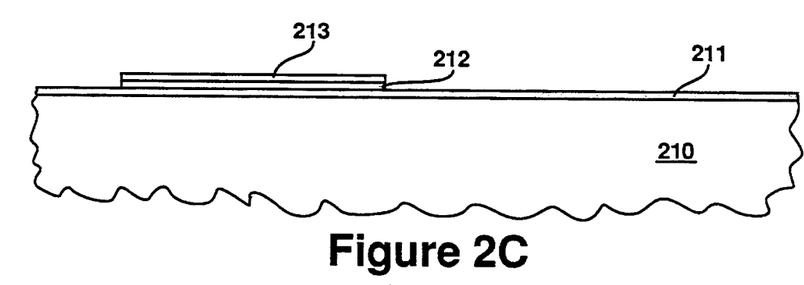

A photoresist layer 220 is coated over the substrate and patterned as shown in FIG. 2B. The exposed portions of the chlorinated silicon nitride barrier layer 213 and silicon nitride layer 212 are dry etched using a plasma. Although the barrier layer 213 is more resistant to attack by the reactive compounds, the barrier layer 213 is believe to have dry etching characteristics similar to the silicon nitride layer 212. The patterned photoresist layer 220 is removed by plasma ashing or a hot mixture of sulfuric acid and hydrogen peroxide. The substrate includes the silicon layer 210, pad oxide layer 211, patterned silicon nitride layer 212, and the patterned barrier layer 213 as shown in FIG. 2C.

Figure 2D:
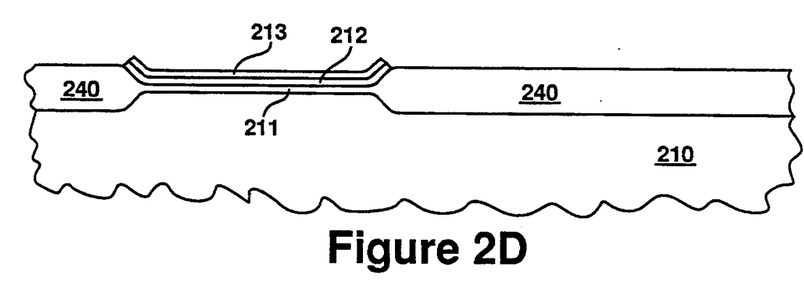

A short hydrofluoric acid dip is used to remove the exposed portion of the pad oxide layer 211. A field oxide layer 240 about 5000 Å thick is thermally gown from the silicon layer during a field oxidation step. The field oxidation step has an ambient including steam at a temperature of about 1000° C. for a time of about 90 minutes. The combination of the barrier layer 213 and the silicon nitride layer 212 acts as an oxidation mask to prevent oxidation of the silicon layer 210 lying beneath the patterned barrier layer 213 and the patterned silicon nitride layer 212. The patterned barrier layer 213 and the patterned silicon nitride layer 212 are typically removed before forming a finished MOS device. In an alternate embodiment, at least a portion of the patterned silicon nitride layer 212 or the patterned barrier layer 213 remain on the substrate and is part of a gate dielectric for a MOS device.

In this example, the chlorination step is performed before the silicon nitride layer is patterned. If the chlorination step is not perforated or performed after the silicon nitride layer is patterned, too much of the silicon nitride layer may be attacked and cause the silicon nitride layer to fail as an oxidation mask during the field oxidation step. A photoresist mask may be "reworked" if the photoresist mask has too many defects. The rework process typically includes removing the photoresist layer by using a hot mixture of sulfuric acid and hydrogen peroxide, coating a new photoresist layer, and patterning the new photoresist layer before the dry etching step. Both the sulfuric acid and hydrogen peroxide are oxidizing agents and may oxidize the silicon nitride layer. A plurality of rework cycles is expected to further oxidize the silicon nitride layer. The hydrofluoric acid dip to remove the pad oxide layer may also remove too much of the oxidized silicon nitride layer. If the silicon nitride layer fails as an oxidation mask during the field oxidation step, the silicon layer 210 beneath the pad oxide layer 211 may be significantly oxidized during the field oxidation step. Therefore, the silicon nitride layer 212 should be chlorinated before the photoresist layer is coated over the substrate.

EXAMPLE 3

AMOS device may be formed using a chlorinated silicon nitride barrier layer as part of a gate dielectric for the MOS device.

Figure 3A:
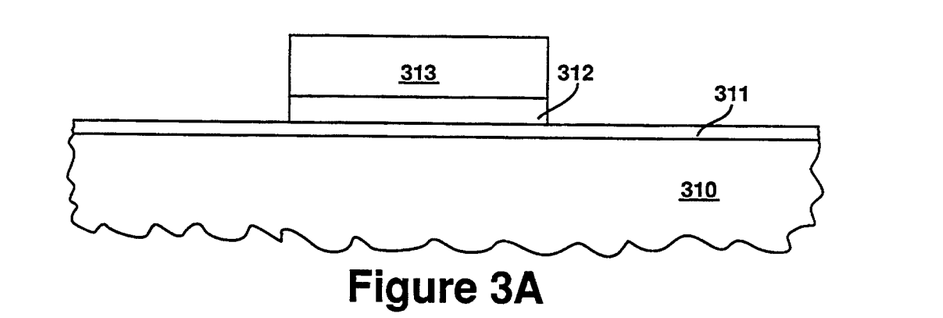
FIGS. 3A–3G include illustrations of cross sectional views of a semiconductor substrate described in conjunction with Example 3.

Referring to FIG. 3A, a pad oxide layer 311 is thermally grown from a monocrystalline silicon layer (silicon layer) 310 of a semiconductor substrate to a thickness of about 100 Å. A first silicon nitride layer 312 is chemically deposited over the pad oxide layer 311 to a thickness of about 1800 Å. A first photoresist layer 313 is coated over the substrate and patterned to form a patterned first photoresist layer 313. The exposed first silicon nitride layer 3 12 is etched using well known dry etching methods to form a patterned first silicon nitride layer 312 as shown in FIG. 3A. The patterned first photoresist layer 313 is removed by plasma ashing or a hot mixture of sulfuric acid and hydrogen peroxide. The exposed pad oxide layer 311 is etched using a hydrofluoric acid solution to form a patterned pad oxide layer 311.

Figure 3B:
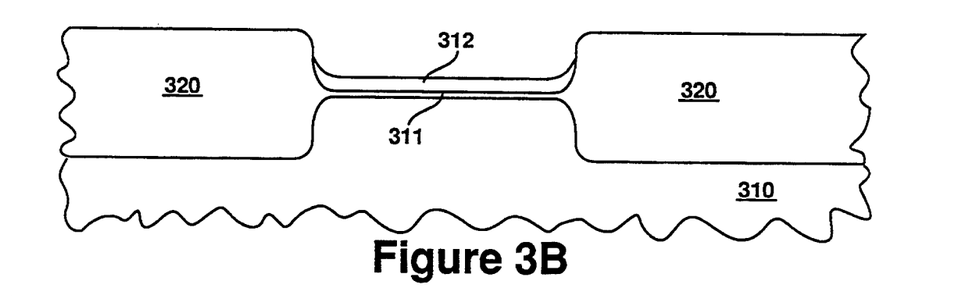
Figure 3C:
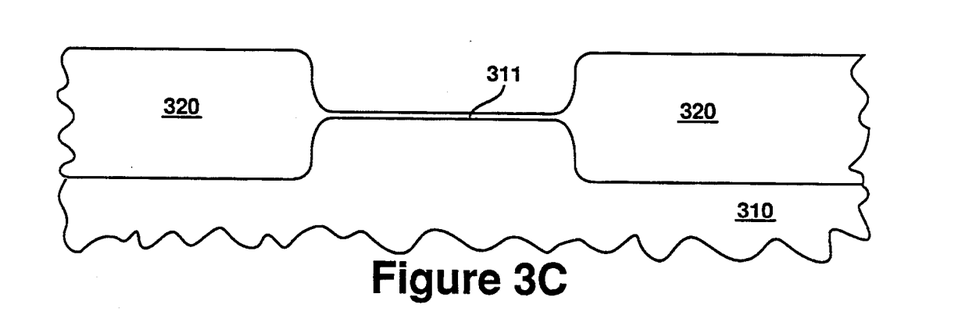

A field oxide layer is thermally grown from the silicon layer 310 in an ambient including steam at about 1000° C. to form field oxide areas 320 about 5000 Å thick as shown in FIG. 3B. The field oxide areas 320 are formed over the silicon layer 310 that is not covered by the patterned first silicon nitride layer 312. The steam from the field oxidation step converts part of the patterned first silicon nitride layer 313 to silicon dioxide. After the field oxidation step, the substrate is dipped in a hydrofluoric acid solution to remove the silicon dioxide formed on the patterned fast silicon nitride layer 313 and is then dipped in a hot phosphoric acid solution to remove the patterned first silicon nitride layer 313. At this point in the process, there is no silicon nitride on the substrate as shown in FIG. 3C. The substrate includes the silicon layer 310, the patterned pad oxide layer 311 and field oxide areas 320.

The patterned pad oxide layer 311 is removed by a short dip in a hydrofluoric acid solution. A sacrificial oxide layer (not shown) about 300 Å thick is thermally grown from tile silicon layer 310 in an ambient including steam. The substrate is implanted with two ion implants. The first ion implant step implant boron ions at an energy of about 200 KeV to a dose of about 5E12 ion/cm$^2$ to increase the field punchthrough voltage. The second ion implant step implants boron ions at an energy of about 60 KeV to a dose of about 1E12 ions/cm$^2$ to adjust the threshold voltage of the device. After the ion implant steps, the sacrificial oxide is removed using a hydrofluoric acid solution. For simplicity, the first and second ion implants are not shown in FIGS. 3D-3G.

Figure 3D:
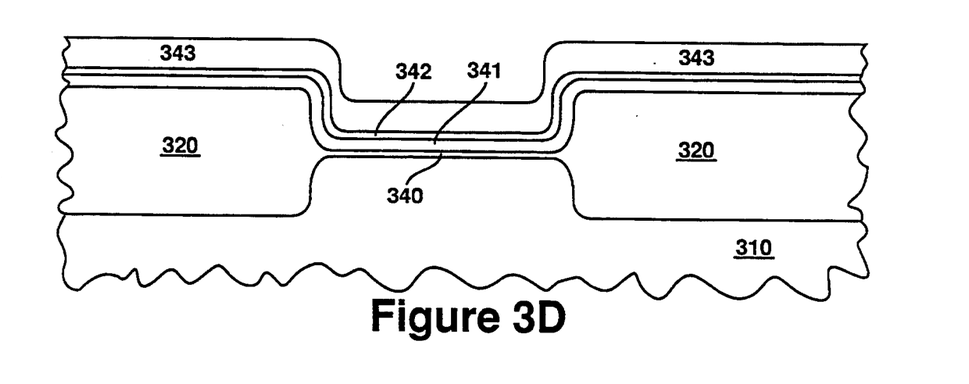

A gate oxide layer 340 is thermally grown from the silicon layer 3 10 between the field oxide areas 320 as shown in FIG. 3D. The gate oxide layer 340 is grown to a thickness of about 100 Å in an ambient including oxygen with about 3% hydrogen chloride at about 900° C. followed by a 15 minute anneal in argon at 1000° C. A second silicon nitride layer 341 is chemically deposited to a thickness of about 100 Å over the substrate. The second silicon nitride layer 341 is chlorinated at about 900° C. in an ambient including oxygen and about 3% hydrogen chloride for about 30 minutes to form a chlorinated silicon nitride barrier layer 342 from a portion of the second silicon nitride layer 341. The time and temperature of the chlorination step may be changed to give the desired resistance to attack by reactive compounds. Longer times and higher temperatures increase the resistance to attack by the reactive compounds, but the longer times and higher temperatures also cause the dopants from the ion implants to diffuse further. Therefore, the chlorination step should be kept as short as possible to give the desired resistance to attack by the reactive compounds without allowing the dopants to diffuse any further than is necessary.

Figure 3E:
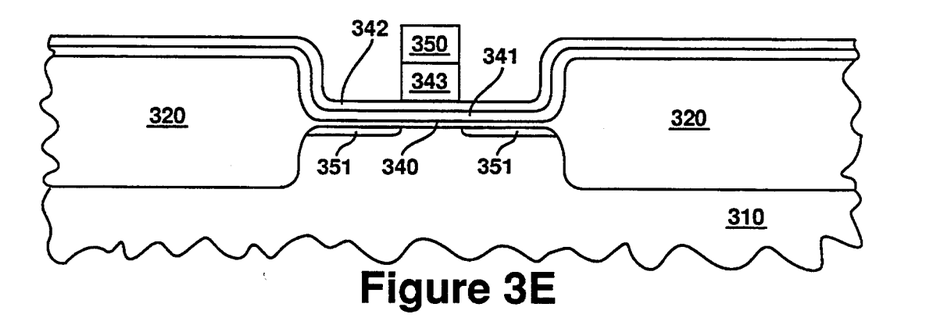

A polycrystalline silicon (polysilicon) layer 343 is deposited over the etch-resistant silicon nitride layer to a thickness of about 2000 Å as shown in FIG. 3D. In alternate embodiments, the polysilicon layer may be replaced by an amorphous silicon layer or an epitaxial silicon layer. The polysilicon layer is doped by ion implantation with phosphorous ions at an energy of about 30 KeV to a dose of about 1E15 ions/cm$^2$. A second photoresist layer is coated over the substrate and patterned to form a patterned second photoresist layer 350 as shown in FIG. 3E. The polysilicon layer 343 is etched using well known dry etching methods to form patterned polysilicon layer having a width of about 0.8 $\mu$m. The substrate is ion implanted with phosphorous ions at an energy of about 35 KeV to a dose of about 1E14 ions/cm$^2$ to form phosphorous doped regions 351 that subsequently diffuse beneath portions of a subsequently formed gate electrode to form tip regions. The patterned second photoresist layer 350 is removed by plasma ashing or a hot mixture of sulfuric acid and hydrogen peroxide.

Figure 3F:
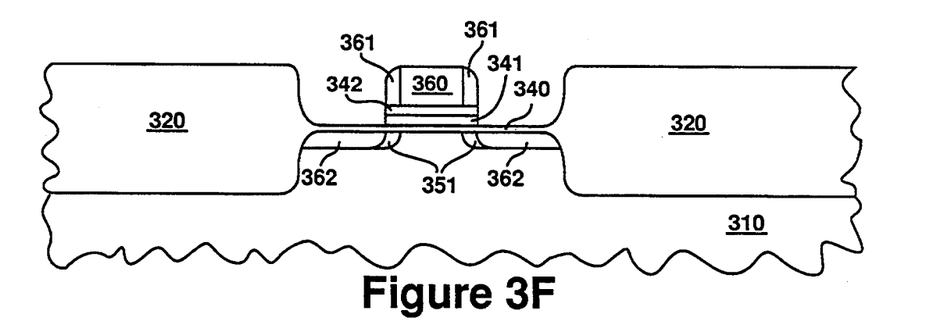

A titanium layer is deposited over the patterned polysilicon layer and is reacted to form titanium silicide. Only part of the polysilicon layer reacts with the titanium to form titanium silicide. The unreacted titanium is removed using well known methods. The patterned polysilicon and titanium silicide layers form a gate electrode 360 as shown in FIG. 3F. An undoped silicon dioxide layer is chemically deposited over the substrate to a thickness of about 2000 Å and is anisotropically etched using well known dry etching methods to form sidewall spacers 361 adjacent to the gate electrode 360. Portions of the second silicon nitride layer 341 and the barrier layer 342 that are not covered by the gate electrode 360 or sidewall spacers 361 are also etched during the sidewall spacer etch step. Although the chlorinated silicon nitride barrier layer 342 is more resistant to attack by the reactive compounds, the barrier layer 342 is expected to have dry etching characteristics similar to a silicon nitride layer that has not been chlorinated. The substrate is ion implanted with arsenic ions at an energy of about 40 KeV to a dose of about 3E15 ions/cm$^2$ to form heavily doped arsenic regions 362.

Figure 3G:
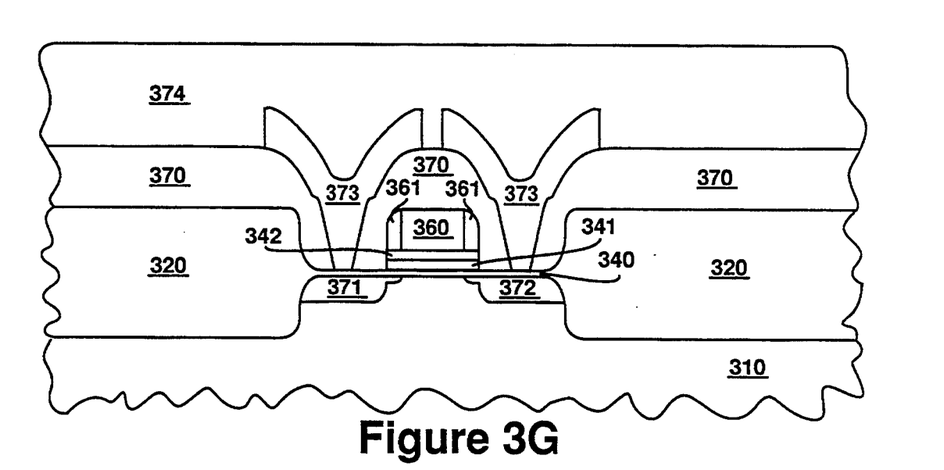

Additional steps are used to form a finished device as shown in FIG. 3G. The additional steps include depositing a borophosphosilicate glass (BPSG) layer 370, forming contact openings through the BPSG layer, performing a thermal cycle to activate the phosphorous doped regions 351 and heavily doped arsenic regions 362 to form a source region 372 and a drain region 371 and densify or reflow the BPSG layer, forming at least one electrical interconnect layer 373, depositing a passivation layer 374, and forming bond pad openings (not shown) through the passivation layer. The additional steps are well known in the art. Other steps including ion implants steps, such as a boron dish implant step for example, may be added.

The example described above includes many processing details. The example is meant to be illustrative and not limiting. One skilled in the art appreciates that many of the processing parameters may be varied. The example includes a device, wherein the gate dielectric comprises the chlorinated silicon nitride barrier layer. In alternate embodiments, the gate oxide layer may be eliminated or the entire second silicon nitride layer may be converted to the chlorinated silicon nitride barrier layer. The choice and thickness of gate dielectric materials are typically affected by electrical characteristics required for the device.

EXAMPLE 4

A floating gate memory cell may be formed using a chlorinated silicon nitride layer as part of an intergate dielectric for the memory cell. The memory cell may be within a memory array of an EPROM, EEPROM, or flash EEPROM device. The example described below forms a flash EEPROM device. FIG. 4A–4G include portions of both the memory array (left-hand portion of the figures) and a peripheral area (right-hand portion of the figures) of the flash EEPROM device.

The processing steps of the device up to and including the formation of the sacrificial oxide layer are the same steps as describe in Example 3. It is noted that the first silicon nitride layer, which is used as an oxidation mask during the field oxidation step has been completely removed from the substrate. The substrate is implanted with two ion implants. The first ion implant step implants boron ions at an energy of about 200 KeV to a dose of about 5E12 ion/cm$^2$ to increase the field punchthrough voltage between transistors within the device. The second ion implant step implants boron ions at an energy of about 60 KeV to a dose of about 7E11 ions/cm$^2$ to adjust the threshold voltage of the transistors within the memory array and the peripheral area. For simplicity, the first and second ion implants are not shown in FIGS. 4A–4G. After the ion implant steps, the sacrificial oxide is removed using a hydrofluoric acid solution.

Figure 4A:
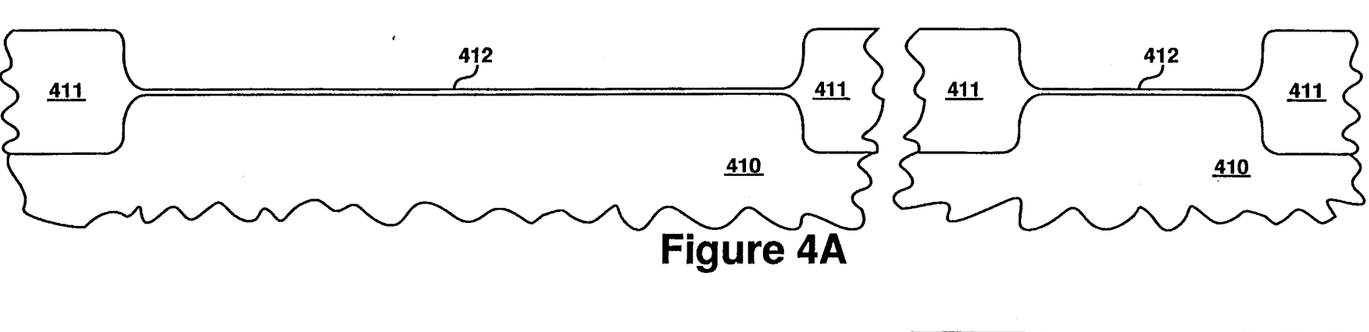
FIGS. 4A–4G include illustrations of cross sectional views of a semiconductor substrate described in conjunction with Example 4.

A tunnel oxide layer 412 is thermally grown from a monocrystalline silicon layer 410 (silicon layer) between field oxide areas 411 as shown in FIG. 4A. The tunnel oxide layer 412 is grown to a thickness of about 100 Å, in an ambient including oxygen and about 3% hydrogen chloride at about 900° C. followed by a 15 minute anneal in argon at 1000° C.

Figure 4B:
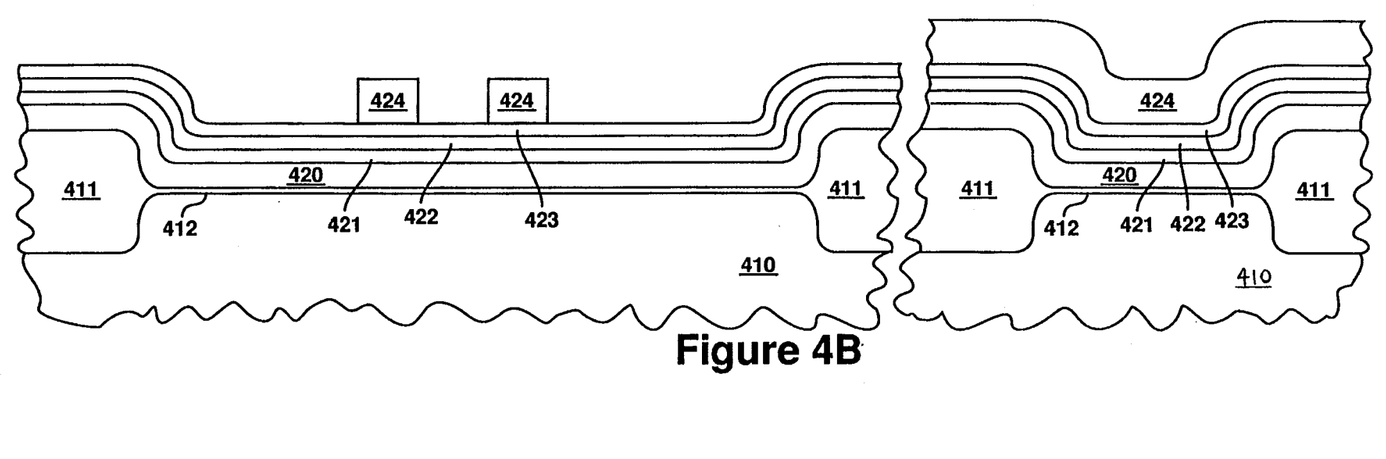
Figure 4C:
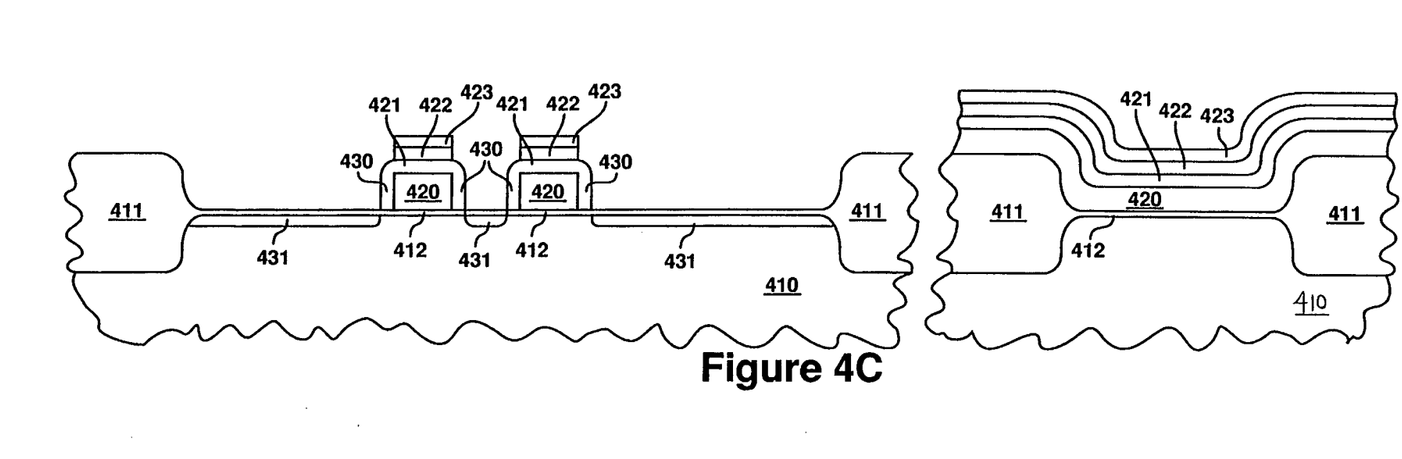

Referring to FIG. 4B, a first polysilicon layer 420 is deposited to a thickness of about 2000 Å over the substrate. In alternate embodiments, any polysilicon layer described in this example may be replaced by an amorphous silicon layer or an epitaxial silicon layer. The first polysilicon layer 420 is ion implanted with phosphorous ions at an energy of about 30 KeV to a dose of about 1E16 ions/cm$^2$. A silicon dioxide layer 421 is thermally grown from the doped polysilicon layer to a thickness of about 100 Å. In an alternate embodiment, the silicon dioxide layer 421 may be chemically deposited. A second silicon nitride layer 422 is chemically deposited to a thickness of about 100 Å over the substrate. The second silicon nitride layer 422 is chlorinated at about 900° C. in an ambient including oxygen and about 3% hydrogen chloride for about 30 minutes to form a chlorinated silicon nitride barrier layer 423 from a portion of the second silicon nitride layer 422. The time and temperature of the chlorination step may be changed to give the desired resistance to attack by reactive compounds. Longer times and higher temperatures increase the resistance to attack by the reactive compounds, but the longer times and higher temperatures also cause the dopants from the ion implants to diffuse further. Therefore, the chlorination step should be kept as short as possible to give the desired resistance to attack by the reactive compounds without allowing the dopants to diffuse any further than is necessary.

A second photoresist layer is coated over the substrate and patterned to form a patterned second photoresist layer 424 as shown in FIG. 4B. The patterned second photoresist layer 424 includes strips within the memory array and covers the peripheral area. As shown in FIG. 4B, the strips are generally parallel to one another and run normal to the surface of the figure. The exposed portions of the barrier layer 423, second silicon nitride layer 422, silicon dioxide layer 421, and first polysilicon layer 420 are etched using well known dry etching methods to form floating gate strips about 0.8 μm wide. Although the chlorinated silicon nitride barrier layer 423 is more resistant to attack by the reactive compounds, the barrier layer 423 is expected to have dry etching characteristics similar to a silicon nitride layer that has not been chlorinated. The patterned second photoresist layer 424 is removed by plasma ashing or a hot mixture of sulfuric acid and hydrogen peroxide.

A sidewall oxide layer 430 is thermally grown from the sides of the patterned first polysilicon layer 420 in an ambient including steam at about 750° C. to a thickness of about 700 Å. The sidewall oxide layer 430 acts as sidewall spacers and protects the patterned first polysilicon layer 420 during subsequent processing steps. The combination of the barrier layer 423 and second silicon nitride layer 422 acts as an oxidation mask and virtually prevents any further oxidation of patterned first polysilicon layer. The substrate is then ion implanted with arsenic ions at an energy of about 30 KeV to a dose of about 5E15 ions/$cm^2$ to form heavily doped arsenic regions 431 within the memory array. The heavily doped arsenic regions 431 are substantially parallel to the floating gate strips and subsequently form source and drain regions within memory array after the dopant has been activated and diffused.

A third photoresist layer is coated over the substrate and patterned to form a patterned third photoresist layer (not shown) that covers the memory array and leaves the peripheral area exposed. The barrier layer 423, second silicon nitride layer 422, silicon dioxide layer, and first polysilicon layer 420 are removed from the peripheral area. The peripheral area is ion implanted with boron ions at an energy of about 60 KeV to a dose of about 5E11 ions/$cm^2$ to further adjust the threshold voltage of the transistors within the peripheral area. The residual tunnel oxide layer 412 within the peripheral area is removed by using a buffered oxide etching solution. The patterned third photoresist layer is removed by plasma ashing or a hot mixture of sulfuric acid and hydrogen peroxide.

Figure 4D:
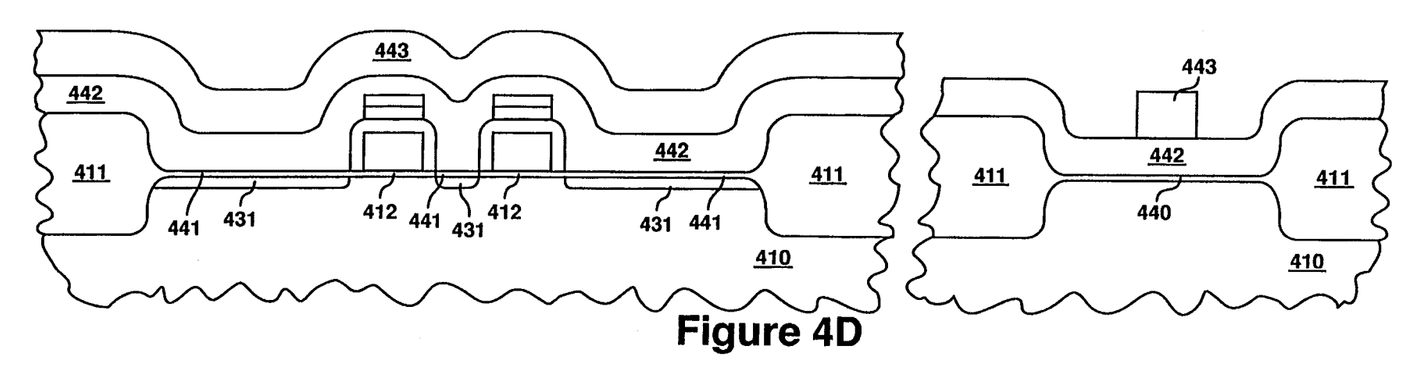

A gate oxidation step including an anneal segment and oxidation segment is performed to grow a gate oxide layer within the peripheral area. The anneal segment is performed in an argon ambient for about 30 minutes at 900° C. to anneal implant damage, if any, caused by the memory array arsenic implant step the barrier layer 423 and second silicon nitride layer 422 within the memory array prior to the oxidation segment. During the oxidation segment, a gate oxide layer 440 about 150 Å thick is formed in the peripheral area between the field oxide areas 411 as shown in FIG. 4D. The gate oxide layer 440 is thermally gown from the silicon layer 410 at about 900° C. in an ambient including oxygen and about 3% hydrogen chloride. The combination of the sidewall and gate oxidation steps forms a relatively thick silicon dioxide layer 441 about 600 Å thick over the heavily doped arsenic regions 431 within the memory array.

Figure 4E:
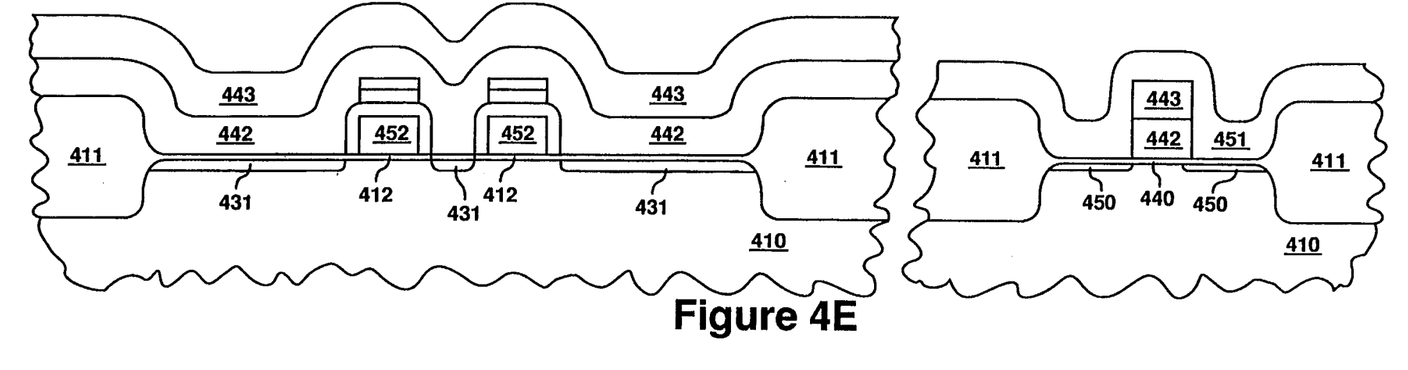

A second polysilicon layer 442 is deposited to a thickness of about 2000 Å over the substrate. The second polysilicon layer is doped by ion implantation using phosphorous ions at an energy of about 30 KeV to a dose of about 1E15 ions/$cm^2$. A fourth photoresist layer is coated over the substrate and patterned to form a patterned fourth photoresist layer 443 as shown in FIG. 4D. The second polysilicon layer 442 is etched using well known dry etching methods to form a patterned second polysilicon layer 442. Within the memory array, the patterned second polysilicon layer 442 includes strips that are generally perpendicular to the floating gate strips. Within the peripheral area, the patterned second polysilicon layer is about 0.8 μm wide. The substrate is ion implanted with phosphorous ions at an energy of about 35 KeV to a dose of about 1E14 ions/$cm^2$ to form phosphorous doped regions 450 in the peripheral area as shown in FIG. 4E. The phosphorous doped regions 450 subsequently form tip regions beneath portions of the gate electrode within the peripheral area.

Before removing the patterned fourth photoresist layer 443, a fifth photoresist layer is coated over the substrate and patterned to form a patterned fifth photoresist layer 451 that covers the peripheral area and leaves the memory array exposed. The patterned fourth photoresist layer 443 still covers the patterned second polysilicon layer 442 within the memory array and peripheral area. The exposed portions of the barrier layer 423, second silicon nitride layer 422, silicon dioxide layer 421, and patterned first polysilicon layer 420 within the memory array are dry etched using well known methods similar to those used to form the floating gate strips. The patterned first polysilicon layer 420 is etched to form floating gate members 452 that are generally rectangular in shape and lie beneath the patterned second polysilicon layer 442 as shown in FIG. 4E. The patterned fourth and fifth photoresist layers are removed by plasma ashing or a hot mixture of sulfuric acid and hydrogen peroxide.

Figure 4F:
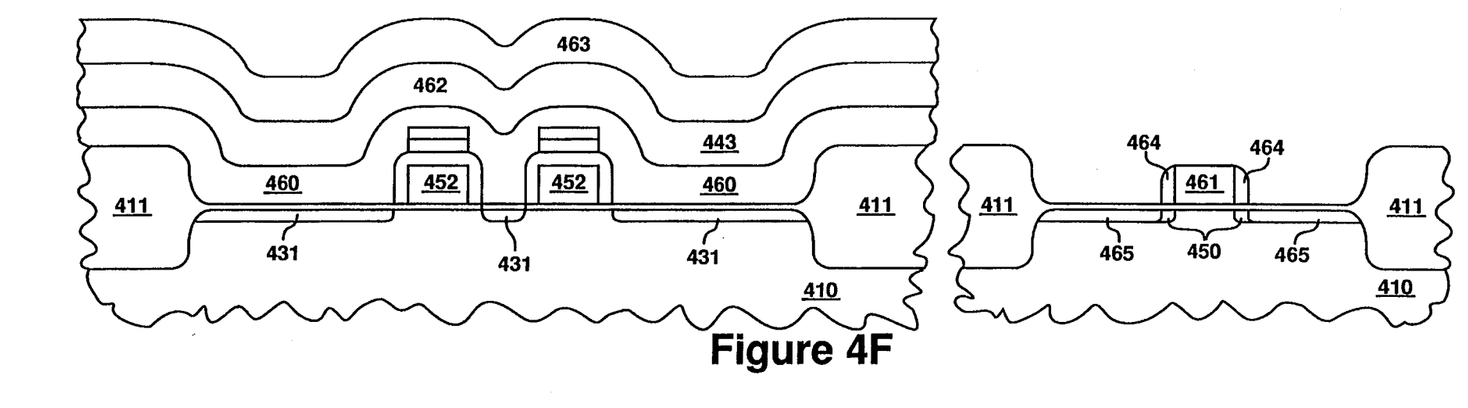

A titanium layer is deposited over the patterned second polysilicon layer 441 and is reacted to form titanium silicide. Only part of the second polysilicon layer 44 1 reacts with the titanium to form titanium silicide. The unreacted titanium is removed using well known methods. The combination of the patterned second polysilicon layer and titanium silicide layer form a word line 460 in the memory array and a gate electrode 461 in the peripheral area as shown in FIG. 4F. The word line 460 forms the control gates for the memory cells. The device includes other word lines and gate electrodes that are not shown.

Referring to FIG. 4F, an undoped silicon dioxide layer 462 is chemically deposited over the substrate to a thickness of about 2000 Å. A sixth photoresist layer is coated over the substrate and patterned to form a patterned sixth photoresist layer 463 that covers the memory array and leaves the peripheral area exposed. The exposed undoped silicon dioxide layer is anisotropically etched to form sidewall spacers 464 adjacent to the gate electrode within the peripheral area. The substrate is ion implanted with arsenic ions at an energy of about 40 KeV to a dose of about 3E15 ions/$cm^2$ to form heavily doped arsenic regions 465 within the peripheral areas shown in FIG. 4F. The heavily doped arsenic regions 465 subsequently form source and drain regions within the peripheral area. The patterned sixth photoresist layer 463 is removed by plasma ashing or a hot mixture of sulfuric acid and hydrogen peroxide.

Figure 4G:
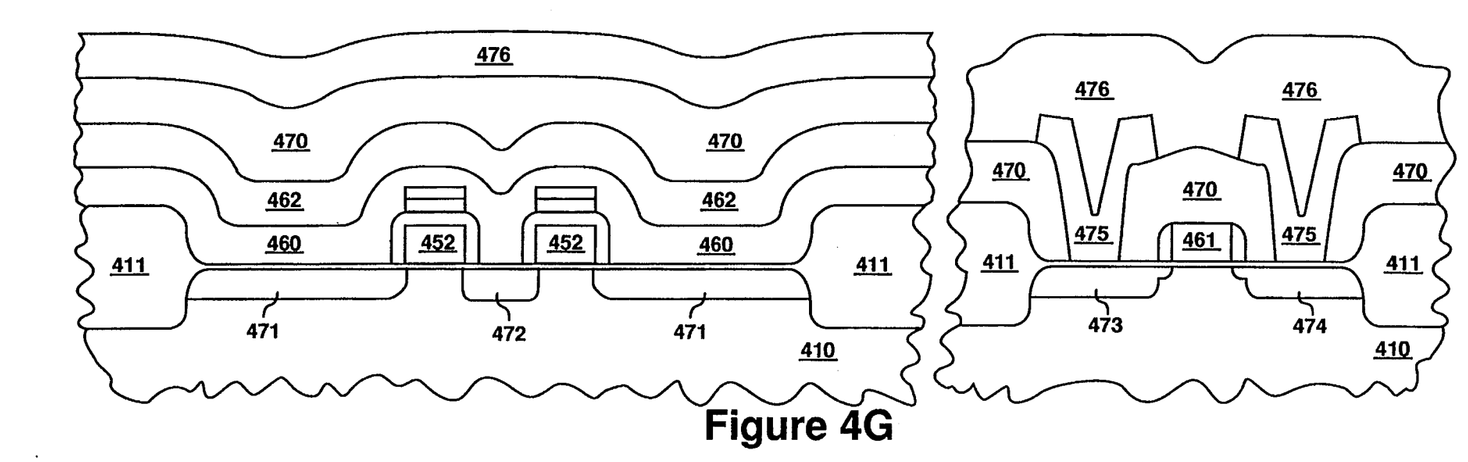

Additional steps are used to form a finished device as shown in FIG. 4G. The additional steps include depositing a borophosilicate glass (BPSG) layer 470, forming contact openings through the BPSG layer, performing a thermal cycle to activate the phosphorous and arsenic dopants and densify or reflow the BPSG layer, forming at least one electrical interconnect layer 475, depositing a passivation layer 476, and forming bond pad openings (not shown) through the passivation layer. The activated phosphorous and arsenic dopants form a source region 472 and drain regions 471 within the memory array and a source region 473 and a drain region 474 within the peripheral area. The additional steps are well known in the art. Other steps including ion implants steps, such as a P-pocket implant step to improve programming performance or a phosphorous implant step to form a graded source region within the memory array to increase the source-substrate diffusion junction breakdown voltage, for example, may be added.

The example described above includes many processing details. The example is meant to be illustrative and not limiting. One skilled in the art appreciates that many of the processing parameters may be varied. The example includes the flash EEPROM device, wherein the intergate dielectric, which is a type of gate dielectric, comprises the chlorinated silicon nitride barrier layer between a plurality of gates (the floating gate and the control gate). In alternate embodiments, the silicon dioxide layer 421 may be eliminated or the entire second silicon nitride layer 422 may be converted to the chlorinated silicon nitride barrier layer 423. The choice and thickness of gate dielectric materials are typically affected by electrical characteristics required for the device.

In the foregoing specification, the invention has been described with reference to specific embodiments thereof. It will, however, be evident that various modifications and changes made thereto without departing from the broader spirit and scope of the invention as set forth in the appended claims. The specification and drawings are, accordingly, to be regarded in an illustrative rather than a restrictive sense.

What is claimed is:

1. A method of forming a patterned silicon nitride layer over a semiconductor substrate comprising the steps of:
    depositing a silicon nitride layer over the substrate;
    exposing the silicon nitride layer to an ambient including chlorine at an elevated temperature for a period of time to form a chlorinated silicon nitride barrier layer that is resistant to attack by at least one reactive compound, wherein the step of exposing is performed before forming a photosensitive layer over the silicon nitride layer;
    forming the photosensitive layer over the chlorinated silicon nitride barrier layer;
    patterning the photosensitive layer to form a patterned photosensitive layer having an opening exposing a portion of the chlorinated silicon nitride barrier layer;
    dry etching the exposed portion of the chlorinated silicon nitride barrier layer to form the patterned silicon nitride layer;
    removing the photosensitive layer;
    performing a thermal oxidation; and,
    removing the patterned silicon nitride layer after the step of performing the thermal oxidation.

2. The method of claim 1, wherein the temperature is between about 800° C. and 950° C. and the period of time is between about 10 minutes and about 60 minutes.

3. The method of claim 1, wherein the chlorine is provided by a chlorine source selected from the group consisting of molecular chlorine, hydrogen chloride, 1,1,1-trichloroethane, and 1,1,2-trichloroethene.

4. The method of claim 1, wherein the reactive compound is selected from the group consisting of sulfuric acid, phosphoric acid, hydrofluoric acid, and steam.

5. The method of claim 1, wherein the barrier layer thickness is between about 5 Å and about 100 Å.

6. A method of forming a patterned silicon nitride layer on a semiconductor substrate including a silicon layer comprising the steps of: depositing a silicon nitride layer on the silicon layer;
    exposing the silicon nitride layer to an ambient including chlorine at an elevated temperature for a period of time to form a chlorinated silicon nitride barrier layer that is resistant to attack by at least one reactive compound, wherein the step of exposing is performed before forming a photosensitive layer over the silicon nitride layer;
    forming the photosensitive layer over the chlorinated silicon nitride barrier layer;
    patterning the photosensitive layer to form a patterned photosensitive layer having an opening exposing a portion of the chlorinated silicon nitride barrier layer;
    dry etching the exposed portion of the chlorinated silicon nitride barrier layer to form the patterned silicon nitride layer;
    removing the photosensitive layer;
    performing a thermal oxidation; and
    removing the patterned silicon nitride layer after the step of performing the thermal oxidation.

7. The method of claim 6, wherein the temperature is between about 800° C. and 1100° C. and the period of time is between about 10 minutes and about 60 minutes.

8. The method of claim 6, wherein the chlorine is provided by a chlorine source selected from the group consisting of molecular chlorine, hydrogen chloride, 1,1,1-trichloroethane, and 1,1,2-trichloroethene.

9. The method of claim 6, wherein the reactive compound is selected from the group consisting of sulfuric acid, phosphoric acid, hydrofluoric acid, and steam.

10. The method of claim 6, wherein the barrier layer thickness is between about 5 Å and about 100 Å.

11. A method of forming a patterned silicon nitride layer on a semiconductor substrate comprising the steps of:
    forming a silicon dioxide layer over the substrate;
    depositing a silicon nitride layer on the silicon dioxide layer;
    before patterning the silicon nitride layer, exposing the silicon nitride layer to an ambient including chlorine at an elevated temperature for a period of time to form a chlorinated silicon nitride barrier layer that is resistant to attack by at least one reactive compound, wherein the step of exposing is performed before forming a photosensitive layer over the silicon nitride layer;
    forming the photosensitive layer over the chlorinated silicon nitride barrier layer;
    patterning the photosensitive layer to form a patterned photosensitive layer having an opening exposing a portion of the chlorinated silicon nitride barrier layer;

dry etching the exposed portion of the chlorinated silicon nitride barrier layer to form the patterned silicon nitride layer;

removing the photosensitive layer;

performing a thermal oxidation, wherein a portion of the silicon dioxide layer that is covered by the patterned silicon nitride layer has approximately the same thickness after the step of performing the thermal oxidation as before the step of performing the thermal oxidation; and, removing the patterned silicon nitride layer after the step of performing the thermal oxidation.

12. The method of claim 11, wherein the temperature is between about 800° C. and 1100° C. and the period of time is between about 10 minutes and about 60 minutes.

13. The method of claim 11, wherein the chlorine is provided by a chlorine source selected from the group consisting of molecular chlorine, hydrogen chloride, 1,1,1-trichloroethane, and 1,1,2-trichloroethene.

14. The method of claim 11, wherein the reactive compound is selected from the group consisting of sulfuric acid, phosphoric acid, hydrofluoric acid, and steam.

15. The method of claim 11, wherein the barrier layer thickness is between about 5 Å and about 100 Å.

16. The method of claim 1 wherein the step of exposing the silicon nitride layer is performed before forming any layer over the silicon nitride layer.

17. The method as described in claim 11 wherein the step of exposing the silicon nitride layer is performed before forming any layer over the silicon nitride layer.

* * * * *